(12) United States Patent
Khlat et al.

(10) Patent No.: US 7,212,587 B2
(45) Date of Patent: May 1, 2007

(54) APPARATUS FOR REDUCING DC OFFSET IN A RECEIVER

(75) Inventors: Nadim Khlat, Cugnaux (FR); Francois Dorel, Thonon-les-Baines (CH)

(73) Assignee: Freescale Semiconductor, Inc., Austin, TX (US)

( * ) Notice: Subject to any disclaimer, the term of this patent is extended or adjusted under 35 U.S.C. 154(b) by 700 days.

(21) Appl. No.: 10/343,540

(22) PCT Filed: Jul. 16, 2001

(86) PCT No.: PCT/EP01/08156

§ 371 (c)(1),
(2), (4) Date: May 12, 2003

(87) PCT Pub. No.: WO02/13473

PCT Pub. Date: Feb. 14, 2002

(65) Prior Publication Data

US 2004/0071238 A1    Apr. 15, 2004

(30) Foreign Application Priority Data

Aug. 4, 2000   (EP)   ................................ 004022234

(51) Int. Cl.
*H04L 25/06*  (2006.01)
(52) U.S. Cl. .................... 375/319; 375/328; 375/344; 375/345; 455/182.2; 455/192.2; 455/214; 455/234.1; 455/240.1
(58) Field of Classification Search ................ 375/316, 375/319, 324, 327, 328, 340, 354, 371, 344, 375/345, 260, 285; 455/182.1, 182, 183.1, 455/183, 192.1, 192, 214, 226.1, 230, 232.1, 455/234.1, 239, 240.1; 329/318–320, 349–353
See application file for complete search history.

(56) References Cited

U.S. PATENT DOCUMENTS 6,327,313 B1 * 12/2001 Traylor et al. ............... 375/316
6,606,359 B1 *  8/2003 Nag et al. .................... 375/348
6,996,383 B2 *  2/2006 Hughes et al. ............... 455/138

FOREIGN PATENT DOCUMENTS

| EP | 0709970 A3 | 5/1996 |
| EP | 0474615 B1 | 3/1998 |
| GB | 2328353 A | 2/1999 |

* cited by examiner

Primary Examiner—Dac V. Ha

(57) ABSTRACT

Apparatus for reducing DC offset in a signal path of a conversion system comprising a front end circuit for providing an input signal having an a DC offset; an amplifier system coupled to the front end circuit to receive and amplify the input signal; a multi-bit sigma delta modulator for receiving the input signal from the amplifier system and providing a first bit quantizer; a DC adapt circuit coupled to the sigma delta modulator for receiving the first bit quantizer from the sigma delta modulator and for providing an operation to reduce DC offset; a digital to analog converter (DAC) coupled to the digital DC adapt circuit to provide an analog signal representative of the DC offset correction to the input of the amplifier system, wherein the digital DC adapt circuit and the DAC form a feedback path originating at the first bit of the multi bit sigma delta modulator to the input of the amplifier system.

9 Claims, 3 Drawing Sheets

APPARATUS FOR REDUCING DC OFFSET IN A RECEIVER

FIELD OF THE INVENTION

This invention relates to radio receivers and more specifically to DC offset correction in direct conversion or digital very low IF receivers that require relatively short DC adapt periods.

BACKGROUND OF THE INVENTION

A direct conversion receiver (DCR) is a type of radio receiver that does not use an intermediate frequency (IF). DCRs and digital very low IF receivers (DVLIF) are becoming common in cellular telephone handsets. A common problem with DCRs is that different components of the receiver may cause a DC offset voltage to be added to a received input signal. The DC offset voltage affects the operation of the receiver in a manner similar to interference. However, unlike interference, the DC offset voltage is generated internally to the receiver.

FIG. 1 illustrates, in block diagram form, a receiver 10 in accordance with the prior art. Receiver 10 includes a low IF front end 12 and a base band receiver 14. Front end 12 includes a low noise amplifier 16, a coupler 18, a mixer 20, a divider 22, and a frequency synthesiser 24. Baseband receiver 14 includes amplifier 30, active low pass filter 32, baseband sigma delta modulator 34, decimation filter 36, digital quad mixers 38, digital filter 40, digital integrator 42, and digital-to-analog converter (DAC) 44.

Each of the components of front end 12 may contribute to the DC offset voltage. For example, leakage from frequency synthesiser 24 may leak back into front end 12 through the antenna and may be mixed back into the signal path via mixer 20. Also, changing the gain of low noise amplifier 16 may change the level of leakage and DC offset.

Prior art receiver 10 uses a feedback path to reduce the DC offset. The feedback path starts at the output of digital filter 40 and feeds back into the signal path at the input of amplifier 30 via DAC 44. This type of feedback path is known as a mixed mode approach, where a digital signal is converted to an analog signal and provided at the input of base band receiver 14. A problem with this approach is that it requires a relatively long period of time to remove the DC offset because of the number of components in the feedback path that contribute to the delay.

Typically, in a cellular telephone system the DC offset is removed during a time period that is prior to the time period used for processing the input signals. In some applications, such as for example, Global System Mobile (GSM), the receiver may need to be powered up from standby mode as early as 400 microseconds prior to processing the received signals in order have enough time to reduce the DC offset. This significantly reduces standby time and increases power consumption.

European Patent Application EP-A-0 709 970 (General Electric Company) describes a DC correction arrangement for an analog-to-signal converter (ADC). The arrangement uses a single bit quantizer and has an accumulator in the feedback correction path.

United Kingdom Patent Application GB-A-2 328 353 (NEC) describes a correction system for use with a baseband receiver having two channels. A feedback signal for the DC offset estimation is provided at a second filter.

Therefore, a need exists for performing DC offset correction in a DCR or a DVLIF receiver that requires a shorter DC adapt period.

BRIEF DESCRIPTION OF THE DRAWINGS

Embodiments of the invention will now be more fully described, by way of example, with reference to the drawings, of which.

DETAILED DESCRIPTION OF EMBODIMENTS OF THE INVENTION

Figure 1:
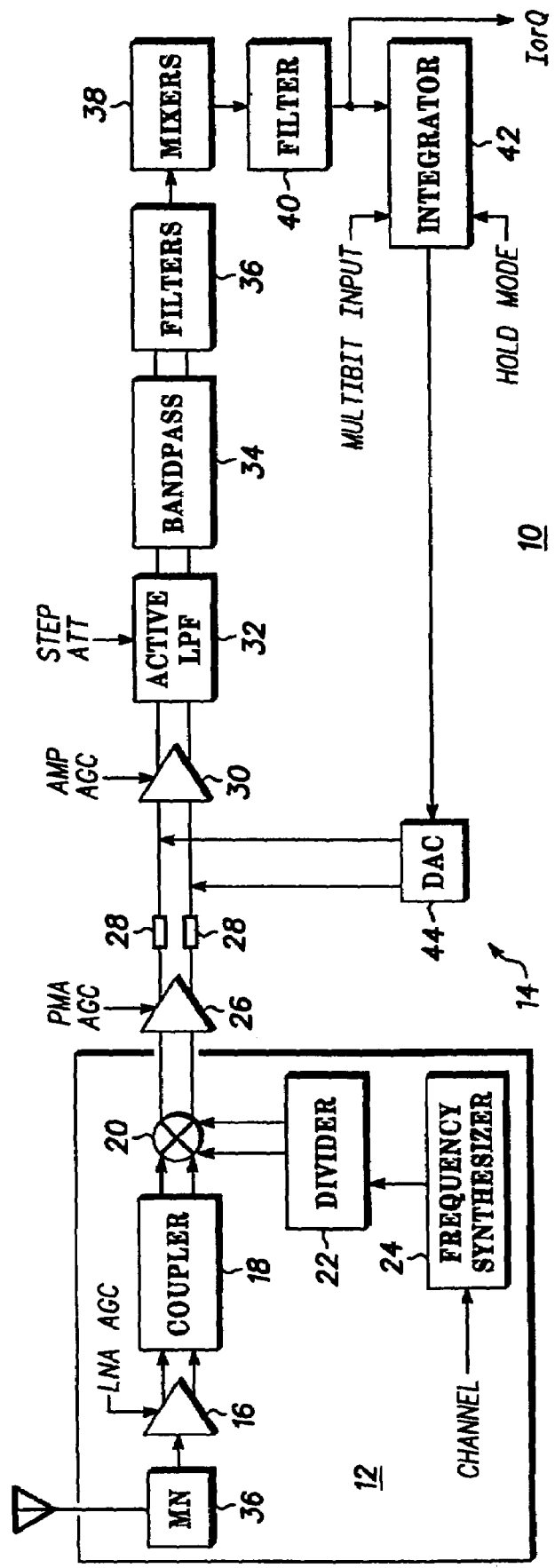
FIG. 1 illustrates, in block diagram form, a radio frequency receiver in accordance with the prior art.

Generally, the present invention provides a DCR 50 that uses a multi-bit sigma delta modulator in a fast coarse adapt feedback path for reducing the DC offset voltage. The digital fast DC adapt circuit 62 reduces the DC offset to an acceptable level without reducing the dynamic range of the analog-to-digital converter. The feedback originates at the first bit of the multi-bit band pass sigma delta modulator 60, where the first bit contains the input information for the feedback path. The digital fast DC adapt circuit 62 includes a one bit accumulator 80 and a first order digital low pass filter 82. By reducing the number of components in the feedback path, and thereby reducing the number of delays, the DC offset can be reduced in less time than with prior art receiver 10 of FIG. 1

Figure 2:
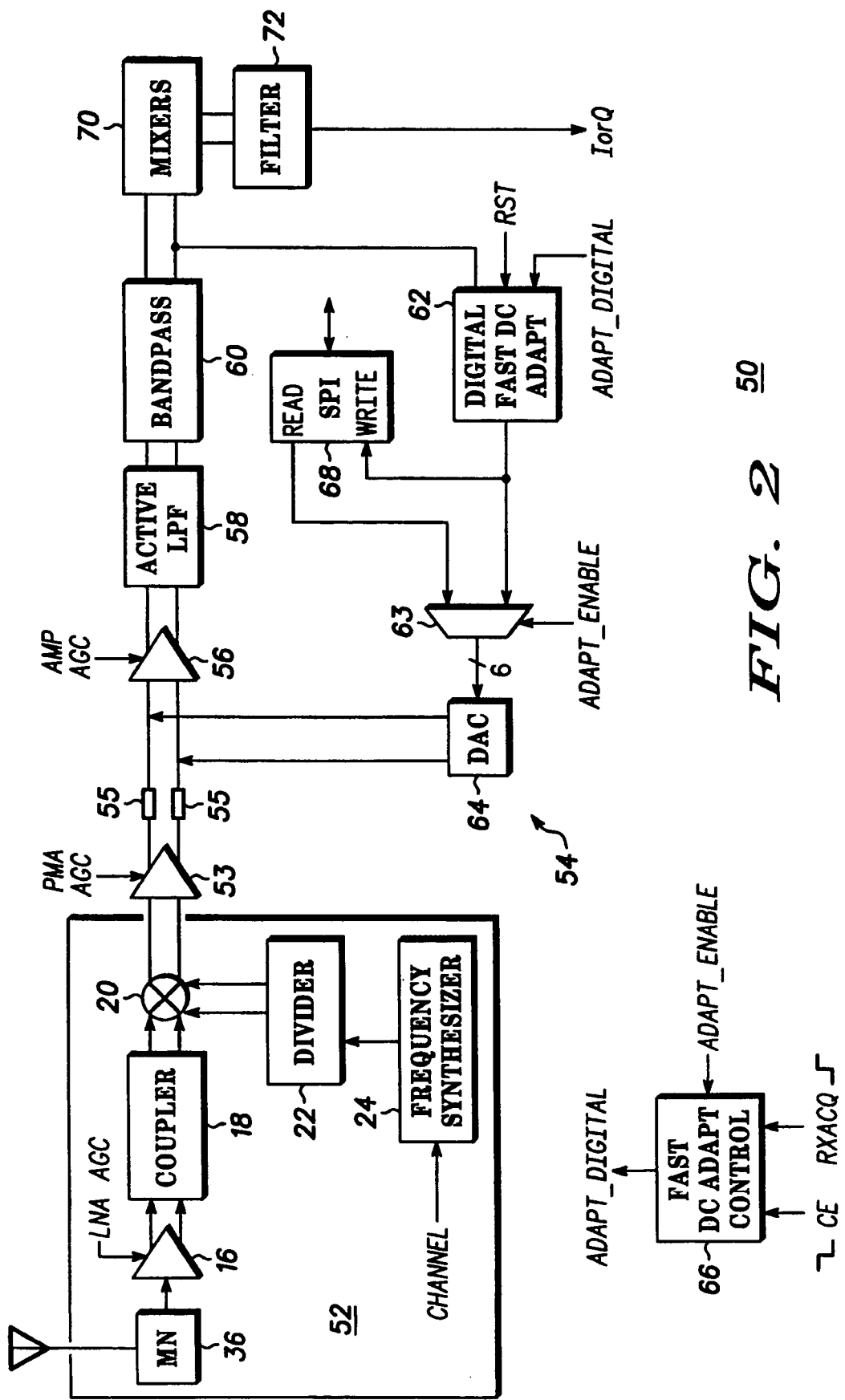
FIG. 2 illustrates, in block diagram form, a radio frequency receiver in accordance with one embodiment of the present invention.

FIG. 2 illustrates, in block diagram form, radio frequency receiver 50 in accordance with one embodiment of the present invention. Receiver 50 includes front end 52 and base band receiver 54. Front end 52 functions similarly to front end 12 of FIG. 1, and will not be described in more detail. Base band receiver 54 includes an amplifier having automatic gain control 56, an active low pass filter 58, a band pass multi-bit sigma delta modulator 60, digital quad mixers 70, digital filter 72, digital fast DC adapt circuit 62, multiplexer 63, DAC 64, fast DC adapt control 66, and serial peripheral interface (SPI) 68. In the illustrated embodiment, front end 52 is implemented on a single integrated circuit. The coupler is a transformer that is formed on the same integrated circuit as front end 52. Likewise, receiver 54 is integrated on a single integrated circuit. In other embodiments, front end 52 and receiver 54 may be implemented on a single integrated circuit or as a combination of multiple integrated circuits.

Amplifier 56 has a pair of input terminals for receiving a differential analog input signal from front end 52. Before being received by amplifier 56, the signals from front end 52 pass through post mixer amplifier 53 and filter 55. Differential outputs of amplifier 56 are coupled to input terminals of active low pass filter 58 and outputs of low pass filter 58 are coupled to inputs of band pass sigma delta modulator 60. In the illustrated embodiment, band pass sigma delta modulator 60 has two output terminals. However, in other embodiments sigma delta modulator 60 may have two or more output terminals. A one bit quantiser signal from sigma delta modulator 60 is provided to an input terminal of fast DC adapt circuit 62 as it contains the DC offset content.

The operation of fast DC adapt circuit 62 is controlled by fast DC adapt control 66. Fast DC adapt control 66 has an input terminal for receiving a chip enable signal labelled CE, and a second input terminal for receiving a control signal labelled RXACQ. In response to these signals DC adapt control 66 provides an output signal labelled ADAPT_DIGITAL to a second input terminal of digital fast DC adapt circuit 62. The signal called ADAPT_DIGITAL is used for starting and stopping the operation of the feedback path to remove the DC offset voltage. Also, in response to receiving the one bit quantiser signal from sigma delta modulator 60, adapt circuit 62 accumulates and then low pass filters the one bit quantiser to produce a six bit output signal labelled DACINP. These six bits are then provided to an input terminal of DAC 64, which converts the digital signal to a differential analog signal which is coupled to the inputs of amplifier 56.

In operation, an input signal having a DC offset is received at the input terminals of amplifier 56. The input signal is then amplified, low pass filtered, and then provided to sigma delta modulator 60. Each of these elements or components can add or contribute to the amount of the DC offset. To remove the DC offset only one bit from the band pass sigma delta modulator 60 is fed back through fast DC adapt circuit 62 and DAC 64 to reduce the amount of DC offset without significantly decreasing dynamic range. For example, if the input signal provided to amplifier 56 has a one volt peak-to-peak signal and a 300 millivolt offset, digital fast DC adapt circuit 62 will reduce the DC offset to about 30 millivolts, providing a dynamic range of about 970 millivolts remaining for the useful signal. The 30 millivolt DC offset is then entirely digitally filtered by digital high pass filters for DCR, or by complex notch filters in DVLIF receivers. This process is called fine DC offset correction. Because there are fewer components in the feedback path and less delay, an adapt period in accordance with the embodiment illustrates in FIG. 1 will be only 40 microseconds long. The 40 microsecond time period is accomplished without sacrificing the stability of the feedback loop.

Any offset caused by DAC 64 will be corrected by the feedback loop. The one bit quantiser of band pass sigma delta modulator 60 is chosen as the feedback point in order to reduce noise introduction into the feedback path when receiver 50 is in receive mode. Because the DC offset is chosen to be reduced rather than eliminated, DAC 64 is only providing a coarse offset correction and does not need to be very accurate. As illustrated in the present embodiment, DAC 64 is implemented in six bits. The type of DAC used for DAC 64 is not important, except that DAC 64 needs to be monotonic.

Most of the open loop gain and phase response of receiver 50 is due to active low pass filter (LPF) 58. When using the DC offset feedback path, sigma delta modulator 60 has a very limited effect in the open loop gain phase response of the feedback path for a stability analysis.

The output of digital fast DC adapt 62 is also provided to an input terminal of SPI 68. The output terminals of SPI 68 are coupled to input/output (I/O) terminals of a microprocessor (not shown). The value of output signal DACINP from digital fast DC adapt circuit 62 can be written through SPI 68 to a register in, for example, a microprocessor and reused as an input to DAC 64 when a gain setting that has been already used in a prior adapt mode. This eliminates the need to run the feedback path before receiving an input signal for a known gain setting. A control signal labelled ADAPT_EN is provided to multiplexer 63 and to fast DC adapt control 66 and is used to select whether a DC offset correction is provided by SPI 68 or by the feedback path circuit 62. When signal ADAPT_EN is asserted to use a prior DACINP signal, the READ path from SPI 68 is selected and fast DC adapt control 66 disables the feedback loop by asserting control signal ADAPT_DIGITAL.

Figure 3:
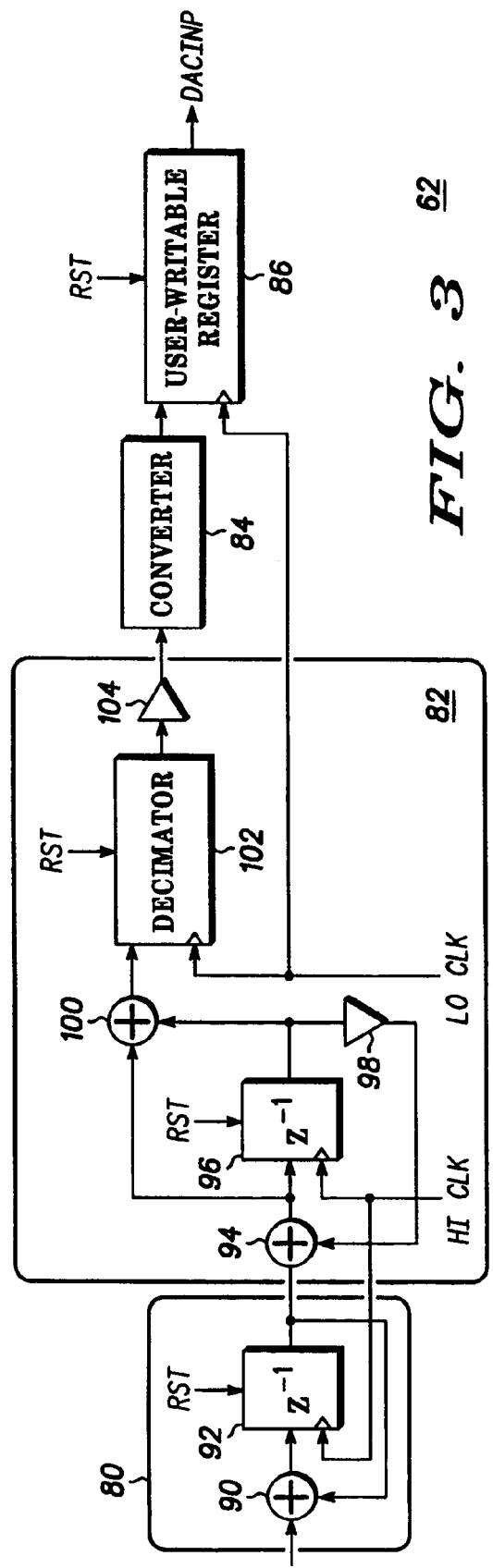
FIG. 3 illustrates the digital fast DC adapt circuit of FIG. 2 in more detail.

FIG. 3 illustrates, in block diagram form, fast DC adapt circuit 62 in more detail. Fast DC adapt circuit 62 includes adders 90, 94, and 100, delay elements 92 and 96, digital multipliers 98 and 104, registers 102 and 86, and twos complement to ones complement conversion logic 84. An accumulator 80 includes adder 90 and delay element 92. Low pass filter 82 includes adders 94 and 100, delay element 96, digital multipliers 98 and 104, and register 102.

An input of accumulator 80 receives the one bit quantiser signal from the output of sigma delta modulator 60. An output of accumulator 80 comprising 9 bits is provided to an input of low pass filter 82. An output of low pass filter 82 is provided to an input of conversion logic 84. Conversion logic 84 converts the output of low pass filter 82 into a ones complement form that can be used by DAC 64. Register 86 is user writable to provide the ability to test DAC 64.

Accumulator 80 performs two functions. The first function of accumulator 80 is to filter noise received from sigma delta modulator 60. The second function is to perform an integration. For example, if the DC offset is positive, the output of accumulator 80 increases. If the DC offset is negative then the output of accumulator 80 decreases. The low pass filter 82 is used to filter the quantisation noise from accumulator 80. Low pass filter 82 provides an additional filtering function and may not be necessary in some embodiments depending on how much of the DC offset is to be removed. Low pass filter 82 has an input for receiving a clock signal labelled HIGH CLOCK and a second input terminal for receiving a clock signal labelled LOW CLOCK. The clock signal HIGH CLOCK operates at the over sampling frequency of sigma delta modulator 60 and the clock signal LOW CLOCK operates at the same frequency as DAC 64. The HIGH CLOCK and LOW CLOCK are enabled or disabled based on the state of control signal. The amount of time that the feedback path operates to reduce the DC offset is predetermined based on the particular application.

The corner of low pass filter 82 is adjusted by changing the coefficient of digital multiplier 98 to accommodate different modes such as for example GSM and NADC.

Figure 4:
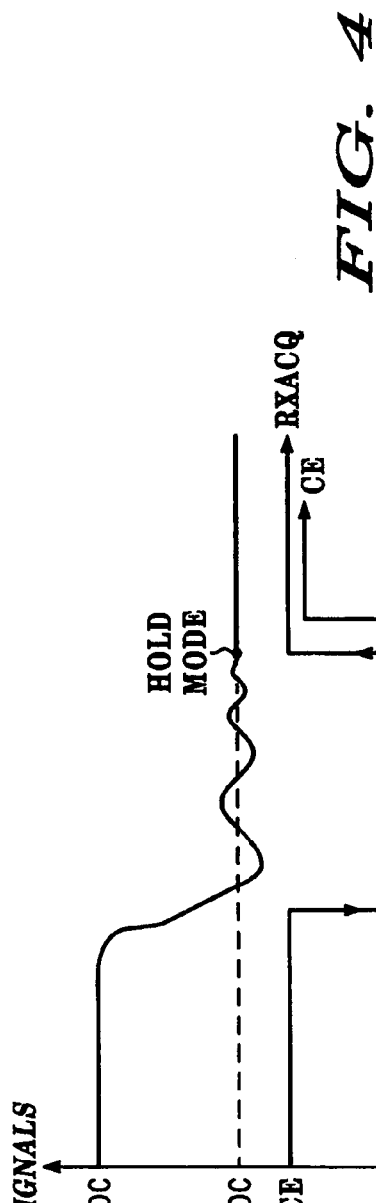
FIG. 4 illustrates a timing diagram of various signals of the receiver illustrated in FIG. 2.

FIG. 4 illustrates a timing diagram of various signals of receiver 50 of FIG. 2. Note that the various waveforms of FIG. 4 are not drawn to scale and are not intended to illusrate any voltage levels relative to the other signals. FIG. 4 is only intened to illustrate a timming relationship between the various signals. Between times t0 and t1, the waveform at the top of FIG. 4 illustrates an input signal at the input of sigma delta modulator 60 having a differential offset of about 60 millivolts. Note that a 60 millivolt offset is chosen for illustration purposes only. Control signal CE is a logic high and control signal RXACQ is a logic low. At time t1, control signal CE is asserted as a logic low to begin the fast adapt time period between t1 and t2 and to start the feedback path DC offset correction. After time t1, it can be observed that coarse DC offset correction has been activated and the DC offset is being reduced to about 0 volts. The time between t1 and t2 is a predetermined time period after which control signal RXACQ is asserted as a logic high. When RXACQ is asserted as a logic high, signal ADAPT$_{13}$ DIGITAL is applied to, stopping the HIGH CLOCK and the LOW CLOCK which causes digital fast adapt circuit 62 to stop operating and to enter a hold mode. Note that in the illustrated embodiment, the time between t1 and t2 is approximately 40 microseconds. In contrast, the time required to remove the DC offset using the prior art circuit illustrated in FIG. 1 is approximately 400 microseconds which is significantly longer. After time t2 the input sigma delta differential input signal has a 0 millivolt DC offset. A predetermined time after time period t2 control signal CE is reset to a logic high.

The circuitry illustrated in FIG. 2 and FIG. 3 contain control signals (not shown) that are used to bias and to provide a quick start up of the system. One problem noted with the start up control and bias signals is a slightly increased DC offset occurring just prior to time t1 in FIG.4 (not shown). The DC offset was observed to momentarily increase before beginning a reduction to 0 millivolts.

By using the system as described herein, the DC offset can be reduced relatively faster than can be accomplished by prior art circuits. Also, because the DC offset is being reduced rather than being eliminated, the DAC 64 can be simpler with reduced bits and reduced resolution. Also, a simple integrated structure is used that receives only the one bit quantiser signal from the multi-bit sigma delta modulator. Therefore, the feedback loop can continue to operate even though the sigma delta modulator is overloaded. In addition, the feedback loop can be easily programmed for various modes and for various adapt time periods by programming the open loop gain of digital multiplier 104 and by controlling the assertion and deassertion of signals CE and RXACQ. The amount the DC offset to be corrected can be improved even further by lowering the bandwidth and by changing the co-efficient of digital multiplier 98. This has the effect of improving the DC offset at the cost of lowering the frequency, lowering the speed, and increasing the DAC resolution. Also, the present embodiment has a hold mode with 0 hertz high pass corner which means there is no drift and the offset value DACINP can be held indefinitely.

The invention claimed is:

1. Apparatus for reducing a DC offset in a signal path of a conversion system comprising:
   a front end circuit for providing an input signal;
   an amplifier system coupled to the front end circuit to receive and amplify the input signal;
   a multi-bit sigma delta modulator for receiving the output signal from the amplifier system and providing a first bit quantizer signal;
   a digital DC adapt circuit coupled to the sigma delta modulator for receiving the first bit quantizer signal from the sigma delta modulator and arranged to reduce a DC offset in said signal path;
   a digital to analog converter coupled to the digital DC adapt circuit to provide an analog signal representative of the DC offset correction to an input of the amplifier system, wherein the digital DC adapt circuit and the digital to analog converter form a feedback path originating from a first bit from the multi bit sigma delta modulator to an input of the amplifier system; and
   a serial peripheral interface coupled to the digital DC adapt circuit to provide an input signal to the digital to analogue converter for a known gain setting.

2. The apparatus as claimed in claim 1 further comprising a DC adapt controller coupled to the digital DC adapt circuit for controlling the starting and stopping of the operation of the DC adapt circuit to reduce a DC offset in said signal path.

3. The apparatus as claimed in claim 2 wherein said DC adapt controller receives an adapt enable signal and has a first input for receiving a chip enable signal, a second input for receiving a DC control signal, and an output for providing a starting and stopping signal to an input of said digital DC adapt circuit for starting and stopping the operation of the feedback path.

4. The apparatus as claimed in claim 1 further comprising a multiplexer receiving the adapt enable signal and coupled to the serial peripheral interface and the digital DC adapt circuit to selectively provide a signal from the serial peripheral interface and the digital DC adapt circuit to the digital to analogue converter.

5. The apparatus as claimed in any preceding claim wherein the digital DC adapt circuit comprises an accumulator to filter noise generated from the sigma delta modulator and to perform integration.

6. The apparatus as claimed in claim 5 wherein the DC adapt circuit further comprises a low pass filter coupled to the accumulator for filtering noise originating from the accumulator.

7. The apparatus as claimed in claim 1 wherein said amplifier system comprises an amplifier having automatic gain control and an active low pass filter.

8. A method for reducing a DC offset in a signal path of a conversion system comprising the steps of:
   providing an input signal from a front end circuit;
   amplifying the input signal in an amplifier system coupled to the front end circuit to provide an amplified output signal;
   passing the amplified output signal though a multi-bit sigma delta modulator to provide a first bit quantizer signal;
   reducing a DC offset in said signal path by use of a digital DC adapt circuit is coupled to the sigma delta modulator for receiving the first bit quantizer signal from the sigma delta modulator and for providing an operation to reduce a DC offset in said signal path, wherein a digital to analog converter coupled to the digital DC adapt circuit provides an analog signal representative of the DC offset correction to an input of the amplifier system, wherein the digital DC adapt circuit and the digital to analog converter form a feedback path originating at the first bit of the multi bit sigma delta modulator to an input of the amplifier system; and
   providing an input signal to the digital to analogue converter for a known gain setting using a serial peripheral interface coupled to the digital DC adapt circuit.

9. The method as claimed in claim 8 further comprising the step of controlling the operation of the digital DC adapt circuit with a DC adapt controller coupled to the digital DC adapt circuit for controlling the starting and stopping of the operation of the DC adapt circuit to reduce a DC offset in said signal path.

* * * * *

UNITED STATES PATENT AND TRADEMARK OFFICE
CERTIFICATE OF CORRECTION

| | |
|---|---|
| PATENT NO. | : 7,212,587 B2 |
| APPLICATION NO. | : 10/343540 |
| DATED | : May 1, 2007 |
| INVENTOR(S) | : Nadim Khlat |

It is certified that error appears in the above-identified patent and that said Letters Patent is hereby corrected as shown below:

In Column 6, Line 16, Claim No. 5:

Change "as claimed in any preceding claim" to --as claimed in claim 1--

Signed and Sealed this

Twenty-seventh Day of May, 2008

JON W. DUDAS
*Director of the United States Patent and Trademark Office*